(12) United States Patent
Dangy-Caye

(10) Patent No.: US 10,094,870 B2
(45) Date of Patent: Oct. 9, 2018

(54) METHOD FOR LOCATING A FAULT

(71) Applicant: SAGECOM BROADBAND SAS, Rueil Malmaison (FR)

(72) Inventor: Nicolas Dangy-Caye, Rueil Malmaison (FR)

(73) Assignee: SAGEMCOM BROADBAND SAS, Rueil Malmaison (FR)

( * ) Notice: Subject to any disclaimer, the term of this patent is extended or adjusted under 35 U.S.C. 154(b) by 0 days.

(21) Appl. No.: 15/325,330

(22) PCT Filed: Jul. 9, 2015

(86) PCT No.: PCT/EP2015/065735
§ 371 (c)(1),
(2) Date: Jan. 10, 2017

(87) PCT Pub. No.: WO2016/005513
PCT Pub. Date: Jan. 14, 2016

(65) Prior Publication Data
US 2017/0184661 A1    Jun. 29, 2017

(30) Foreign Application Priority Data
Jul. 10, 2014  (FR) ..................................... 14 56688

(51) Int. Cl.
*G01R 31/28* (2006.01)
*H01R 13/66* (2006.01)
(Continued)

(52) U.S. Cl.
CPC ....... *G01R 31/2825* (2013.01); *G01R 31/025* (2013.01); *H01R 13/6616* (2013.01);
(Continued)

(58) Field of Classification Search
CPC ...... G01R 31/00; G01R 31/08; G01R 31/086; G01R 31/088; G01R 31/281;
(Continued)

(56) References Cited

U.S. PATENT DOCUMENTS 4,920,555 A * 4/1990 Ingalsbe ................. H04M 1/24
379/21
5,123,854 A   6/1992 Petersen et al.
(Continued)

FOREIGN PATENT DOCUMENTS

DE   202010008678 U1   2/2011
EP       0654865 A1    5/1995
(Continued)

*Primary Examiner* — Son Le
(74) *Attorney, Agent, or Firm* — Muncy, Geissler, Olds & Lowe, P.C.

(57) ABSTRACT

The invention concerns a method for locating a fault affecting an electrical appliance that comprises a communication interface and a female electrical connector, the female electrical connector comprising at least one conductive element mounted movable between an active position and a rest position, the female electrical connector comprising test means connected to the conductive element when same is in the rest position; the locating method comprising: a disconnection step; a test step consisting of testing the communication interface by cooperating with the test means of the female electrical connector; a locating step consisting of locating the fault in the electrical appliance or in an external element.

8 Claims, 3 Drawing Sheets

(51) Int. Cl.
*H01R 13/703* (2006.01)
*H04M 1/24* (2006.01)
*G01R 31/02* (2006.01)
H01R 24/64 (2011.01)
H04M 1/02 (2006.01)

(52) U.S. Cl.
CPC .......... *H01R 13/7033* (2013.01); *H04M 1/24* (2013.01); *H01R 24/64* (2013.01); *H01R 2201/20* (2013.01); *H04M 1/0274* (2013.01)

(58) Field of Classification Search
CPC .... G01R 31/285; G01R 31/02; G01R 31/024; G01R 31/025; H04M 1/02; H04M 1/0274; H04M 3/08; H04M 3/085
See application file for complete search history.

(56) References Cited

U.S. PATENT DOCUMENTS

| | | | | |
|---|---|---|---|---|
| 5,312,273 | A | * | 5/1994 | Andre ................ H01R 13/6582 439/607.26 |
| 2008/0267359 | A1 | | 10/2008 | Chan et al. |
| 2010/0074415 | A1 | * | 3/2010 | Knudson ............... H04M 3/308 379/21 |

FOREIGN PATENT DOCUMENTS

| | | |
|---|---|---|
| FR | 2952760 A1 | 5/2011 |
| WO | WO 97/45899 | 12/1997 |

* cited by examiner

METHOD FOR LOCATING A FAULT

The invention relates to the field of connectors used for conveying electrical signals, and in particular for connecting electrical appliances to the Internet. The invention relates more particularly to detecting and locating faults that impact connections of this type.

BACKGROUND OF THE INVENTION

The testability of an electrical appliance (embedded, domestic, etc.), i.e. the capacity of the electrical appliance to detect and locate a fault disturbing its operation, constitutes a major issue in designing said electrical appliance. Good testability, leading to high rates of detection and location being obtained, is advantageous at the time the electrical appliance is manufactured, since such high rates make it possible to guarantee that the electrical appliance as delivered to the user is operational. When the electrical appliance is in service with a user, good testability also makes it possible to diagnose a fault effectively and to guide the user quickly towards an appropriate solution for correcting the fault.

For an electrical appliance of the modem, residential gateway, television decoder, etc., type, e.g. having a communications interface of the asymmetrical digital subscriber line (ADSL) type, in the event of there being a problem impacting the Internet access of the electrical appliance, it is appropriate to determine whether the problem comes from the ADSL communications interface of the electrical appliance or else from an element that is external to the appliance (Ethernet electric cable, ADSL filter, telephone socket, telephone line, etc.). A method that is presently in use for testing the communications interface consists in disconnecting the Ethernet electric cable, in connecting the electrical appliance to a test accessory delivered with the electrical appliance, and including a 100 ohm resistor simulating the impedance of the telephone line and of the electric cable, and in running a test program for testing the communications interface.

That method presents a certain number of drawbacks. At the time the electrical appliance is manufactured, it requires action on the part of a technician on the production line, which presents an impact that is not negligible in terms of duration and cost in manufacturing the electrical appliance. When the electrical appliance is in service with a user, that method requires the user to perform actions that are technically relatively complex for most users. That method also requires the use of the test accessory, and since it is used rarely there is a high risk of it being mislaid by the user. In the event of the test accessory being lost, the user is therefore obliged to take the electrical appliance to an agency or to a point-of-sale even though it is entirely possible that the electrical appliance is fully operational.

OBJECT OF THE INVENTION

An object of the invention is to improve locating a fault that impacts an electrical appliance of the modem, residential gateway, television decoder, etc. type.

SUMMARY OF THE INVENTION

In order to achieve this object, there is provided a locating method for locating a failure impacting an electrical appliance having a communications interface and a female electric connector connected to the communications interface, the female electric connector having at least one conductor element mounted to move between an active position and a rest position, the active position being the position into which the conductor element is taken when a male electric connector is inserted in the female electric connector, and the rest position being the position of the conductor element when the male electric connector is not inserted in the female electric connector, the female electric connector including test means connected to the conductor element when it is in the rest position; the locating method comprising:

a disconnection step performed by a user of the electrical appliance and consisting in disconnecting the male electric connector from the female electric connector;

a test step consisting in testing the communications interface in co-operation with the test means of the female electric connector;

a locating step consisting in locating the failure in the electrical appliance if the communications interface is faulty or in an element external to the electrical appliance if the communications interface is not faulty.

The locating method of the invention makes it possible in quick and simple manner to locate a fault impacting the electrical appliance, i.e. to determine whether the fault comes from the communications interface of the appliance or else from an external element.

The fault locating method does not require a separate test accessory to be used.

In order to perform the locating method, it suffices to disconnect the male electric connector from the female electric connector, i.e. to unplug from the electrical appliance the electric cable having its male electric connector connected to the female electric connector, thereby causing the conductor element of the female electric connector to go to its rest position. The communications interface is then connected via the conductor element to the test means and can therefore be tested.

The invention can be better understood in the light of the following description of a particular non-limiting implementation of the invention.

BRIEF DESCRIPTION OF THE DRAWINGS

Reference is made to the accompanying drawings, in which.

DETAILED DESCRIPTION OF THE INVENTION

Figure 1:
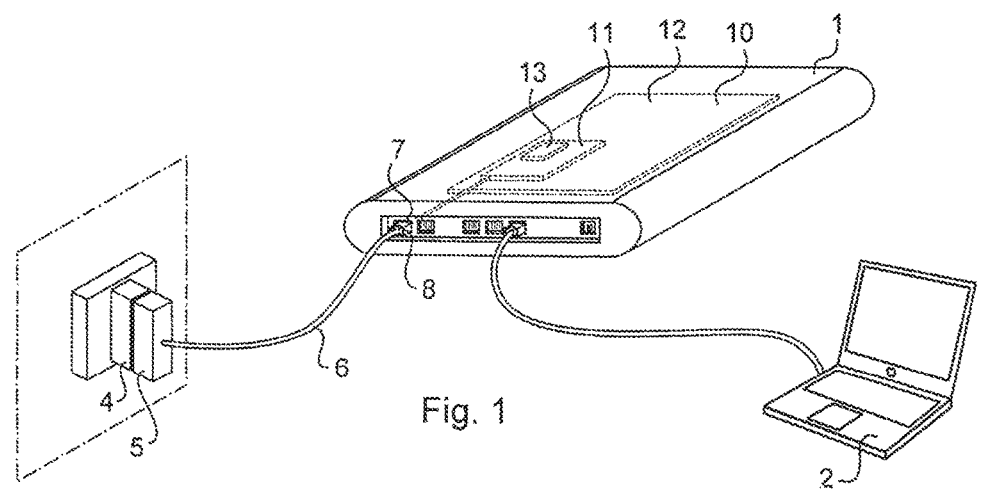
FIG. 1 shows an electrical appliance of the invention, specifically a residential ADSL gateway seen from behind and connected to a computer and to a telephone line.

With reference to FIG. 1, the electrical appliance of the invention in this example is a residential gateway connected to a computer 2 in order to enable the computer to exchange data over the Internet by means of an ADSL type connection.

The residential gateway 1 is connected to a telephone line via a telephone socket 4, an ADSL filter 5, and an electric cable 6 of the Ethernet cable type. The connection between the residential gateway 1 and the electric cable 6 is made via a female electric connector of the invention situated at the rear of the residential gateway 1 and a complementary male electric connector 8 fitted to the electric cable 6.

In addition to the female electric connector 7, the residential gateway 1 has a liquid crystal display (LCD) display 9 (not visible in FIG. 1 since it is situated at the front of the residential gateway 1, but visible in FIG. 9), an electronic card 10 having electronic components mounted thereon, and various elements that are conventionally present on such a residential gateway and that are not mentioned herein (power supply connector, etc.).

The electronic card 10 includes in particular an ADSL communications interface 11 connected to the female electric connector 7 in order to manage transmitting and receiving data exchanged by the computer 2 via the residential gateway 1. This communications interface 11 has a test module 13, that performs a role described in greater detail below.

The female electric connector 7 and the male electric connector 8 are both RJ45 type connectors.

With reference to FIGS. 2 to 7, the female electric connector 7 has a cavity 15 into which there extend eight conductor elements 16 in the form of spring blades given general numerical reference 16 and particular numerical references 16.1, 16.2, 16.3, . . . , 16.8. The cavity 15 is for receiving the male electric connector 8 of the electric cable 6 that itself has eight complementary conductor elements. Each conductor element of the female electric connector 7 establishes an electrical connection with a complementary conductor element by contact when the male electric connector 8 is inserted in the female electric connector 7.

Each conductor element 16 is extended by a stationary conductor blade 18 that extends into an end of the cavity 15 of the female electric connector 7 and that is itself secured to a pin 19 soldered to the electronic card 10 of the residential gateway 1.

The eight conductor elements 16 of the female electric connector 7 are mounted to move between an active position and a rest position.

Figures 2, 3, 4:
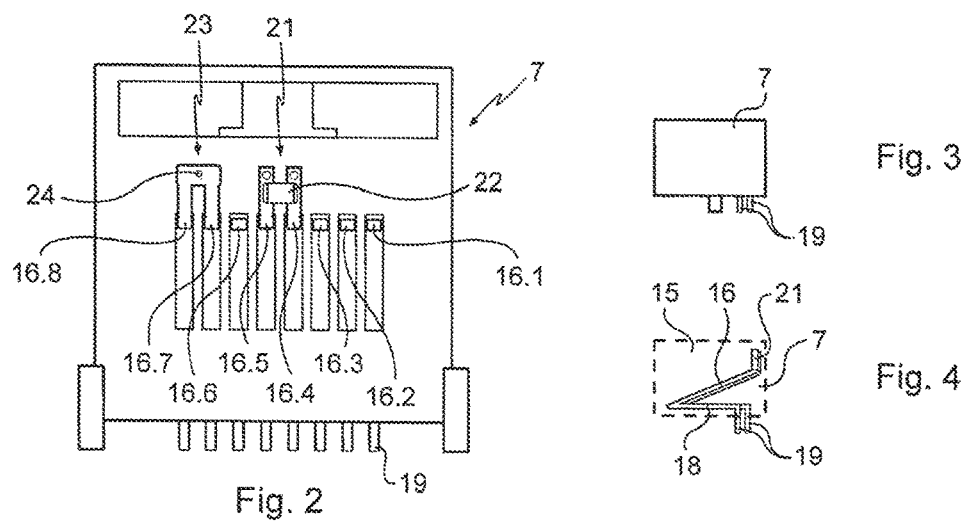
FIG. 2 is a rear view of the female electric connector of the invention while no complementary male connector is inserted in the female connector.
FIG. 3 is a side view of the FIG. 2 connector.
FIG. 4 is a side view analogous to the view of FIG. 3, but drawn transparently, so that conductor elements situated in a cavity in the female electric connector can be seen.

The rest position, shown in FIGS. 2 to 4, is a position in which the conductor elements 16 are to be found when the male electric connector 8 of the electric cable 6 is not inserted in the female electric connector 7. This rest position corresponds to the conductor elements 16 being in a high position in the cavity 15.

Figures 5, 6, 7:
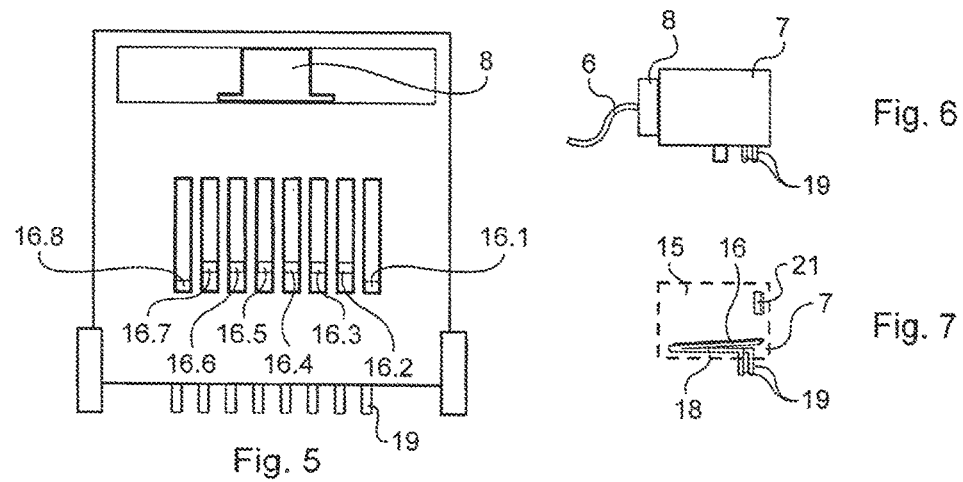
FIG. 5 is a view analogous to the view of FIG. 2, in which the complementary male electric connector is inserted in the female electric connector.
FIG. 6 is a side view of the female electric connector of FIG. 5.
FIG. 7 is a view analogous to the view of FIG. 4, in which the complementary male electric connector is inserted in the female electric connector.

The active position, shown in FIGS. 5 to 7, is a position into which the conductor elements 16 are taken when the male electric connector 8 of the electric cable 6 is inserted in the female electric connector 7. This active position corresponds to the conductor elements 16 being in a low position in the cavity 15, in which each conductor element 16 is positioned in contact with the associated stationary blade 19 and is substantially parallel thereto.

Test means 21 are positioned in the female electric connector 7 in a high portion of the cavity 15 of the female electric connector 7. The test means 21 are used by the test module 13 to determine whether the communications interface 11 is or is not functional. The test means 21 simulate the behavior of a telephone line and an electric cable that are operational, i.e. that are not suffering a fault (open-circuit, short-circuit, etc.). Thus, a failure detected by the test module 13 and having an impact on the ability of the residential gateway 1 to access the Internet comes necessarily from the communications interface 11.

The test means 21 are arranged so as to be connected between two first conductor elements when the conductor elements 16 are in the rest position. The two first conductor elements in this example are the conductor elements 16.4 and 16.5, which are the "active" conductor elements of the ADSL connection, i.e. the conductor elements 16 that convey the electrical signals corresponding to the data exchanged by the computer 2 via the residential gateway 1. The first conductor elements 16.4 and 16.5 are connected to the communications interface 11, and in particular to the test module 13 of the communications interface 11 when the first conductor elements 16.4 and 16.5 are in the rest position.

In this example, the test means 21 are constituted by a resistor 22 having a resistance of 100 ohms, which corresponds to the impedance of the telephone line.

Detector means 23 are also positioned in the female electric connector 7 in the high portion of the cavity 15 of the female electric connector 7. The detector means 23 are for detecting whether the male electric connector 8 is or is not inserted in the female electric connector 7. The detector means 23 are arranged so as to be connected between two second conductor elements when the conductor elements 16 are in the rest position. The two second conductor elements in this example are the conductor elements 16.7 and 16.8. The second conductor elements 16.7 and 16.8 and the detector means 23 are connected to the communications interface when the two second conductor elements 16.7 and 16.8 are in the rest position.

In this example, the detector means 23 are constituted by a shunt 24 that short-circuits the two second conductor elements 16.7 and 16.8 together when the two second conductor elements 16.7 and 16.8 are in the rest position.

The operation of the test means 21 and of the detector means 23 is described in greater detail with reference to FIGS. 8 and 9.

Figure 8:
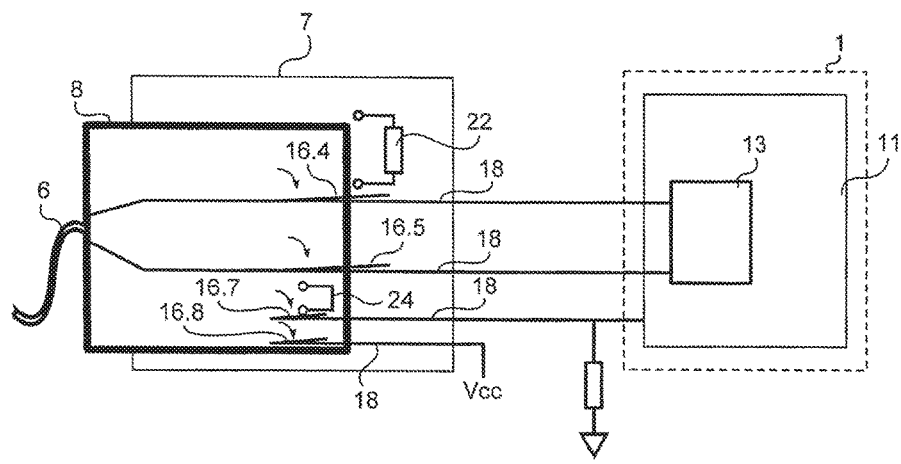
FIG. 8 is an electrical circuit diagram showing the electrical appliance and the female electric connector provided with test means and detection means, with the male electric connector inserted in the female electric connector.

When the male electric connector 8 of the electric cable 6 is inserted in the female electric connector 7, as shown in FIG. 8, the first conductor elements 16.4 and 16.5 are in the active position and are therefore physically spaced apart from the resistor 22 and the shunt 24.

The first conductor elements 16.4 and 16.5 are connected to the corresponding complementary conductor elements of the male electric connector. Data can be exchanged between the Internet and the computer 2 via the communications interface 11 of the residential gateway 1.

At the same time, the second conductor elements 16.7 and 16.8 are not short-circuited. Applying a voltage Vcc to the second conductor element 16.8 does not generate any electrical signal at the second conductor element 16.7, and this is interpreted by the communications interface 11 as an indication that the male electric connector 8 is inserted in the female electric connector 7.

Figure 9:
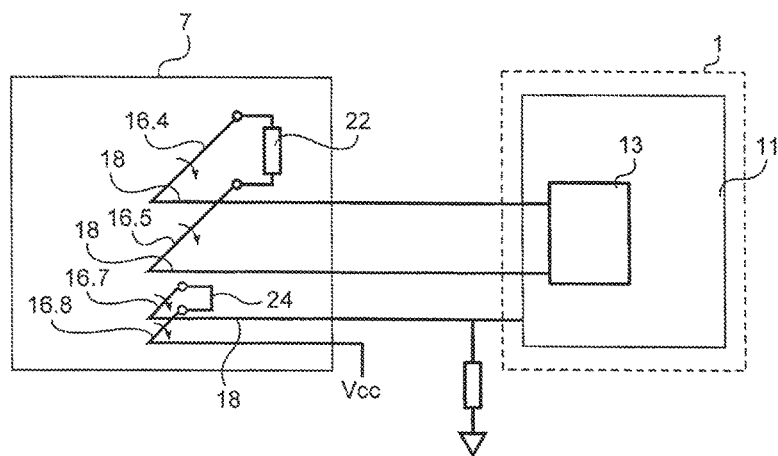
FIG. 9 is a view analogous to the view of FIG. 6, in which the male electric connector is not inserted in the female electric connector.

When the male electric connector 8 of the electric cable 6 is not inserted in the female electric connector 7, as shown in FIG. 9, the conductor elements 16 are in the rest position.

The first conductor elements 16.4 and 16.5 are connected to the resistor 22. The test module 13 can thus carry out tests to verify the operation of the communications interface 11 by using the resistor 22 connected to the first conductor elements 16.4 and 16.5.

Meanwhile, the second conductor elements 16.7 and 16.8 are short-circuited by the shunt 24. The voltage at the second conductor element 16.7 is substantially equal to the voltage at the second conductor element 16.8. Applying a voltage Vcc to the second conductor element 16.8 thus generates a similar voltage at the second conductor element 16.7, which is interpreted by the communications interface 11 as an indication that the male electric connector 8 is not inserted in the female electric connector 7.

The residential gateway 1 is thus adapted to operate in two modes: a normal mode and a test mode.

The normal mode is a mode in which data can be exchanged between the Internet and the computer 2 via the communications interface 11 and the residential gateway 1. This normal mode thus requires the male electric connector 8 of the electric cable 6 to be inserted in the female connector 7 of the residential gateway 1.

The test mode is a mode in which the test means 21 are connected to the test module 13 of the communications interface 11. This test mode thus requires the male electric connector 8 of the electric cable 6 not to be inserted in the female electric connector 7 of the residential gateway 1.

It should be observed at this point that the detector means 23 provide two advantages relating to the existence of these two modes of operation of the residential gateway 1.

The detector means 23 make it possible to place the residential gateway 1 in the appropriate mode of operation, depending on whether the presence of the male electric connector 8 is or is not detected. The detector means 23 also serve to validate the result of the test performed by the test module 13 that seeks to determine whether the communications interface 11 is or is not operational. Specifically, if the test indicates that the communications interface 11 is not operational, it is necessary to be certain that the resistor 22 is properly connected to the test module 13 and thus that the male electric connector 8 is not inserted in the female electric connector 7. Thus, a failure detected by the test module 13 and having an impact on the Internet access of the residential gateway 1 comes necessarily from the communications interface 11 and is not due to the test module 13 erroneously detecting a short-circuit coming from the fact that the test module considers, wrongly, that the resistor 22 is connected to the first conductor elements 16.4 and 16.5.

The test method of the invention is described below, which method, in this example, serves to test the communications interface 11 of the residential gateway 1.

This test method needs to be launched by a user who has observed that there is a problem with the Internet access of the residential gateway 1. The test procedure enables the failure to be located, e.g. specifically, to discover whether the failure comes from the residential gateway 1 and in particular the communications interface 11, or whether it comes from an element external to the appliance (from the electric cable 6, the ADLS filter 5, the telephone socket 4, the telephone line 3, etc.).

Figure 10:
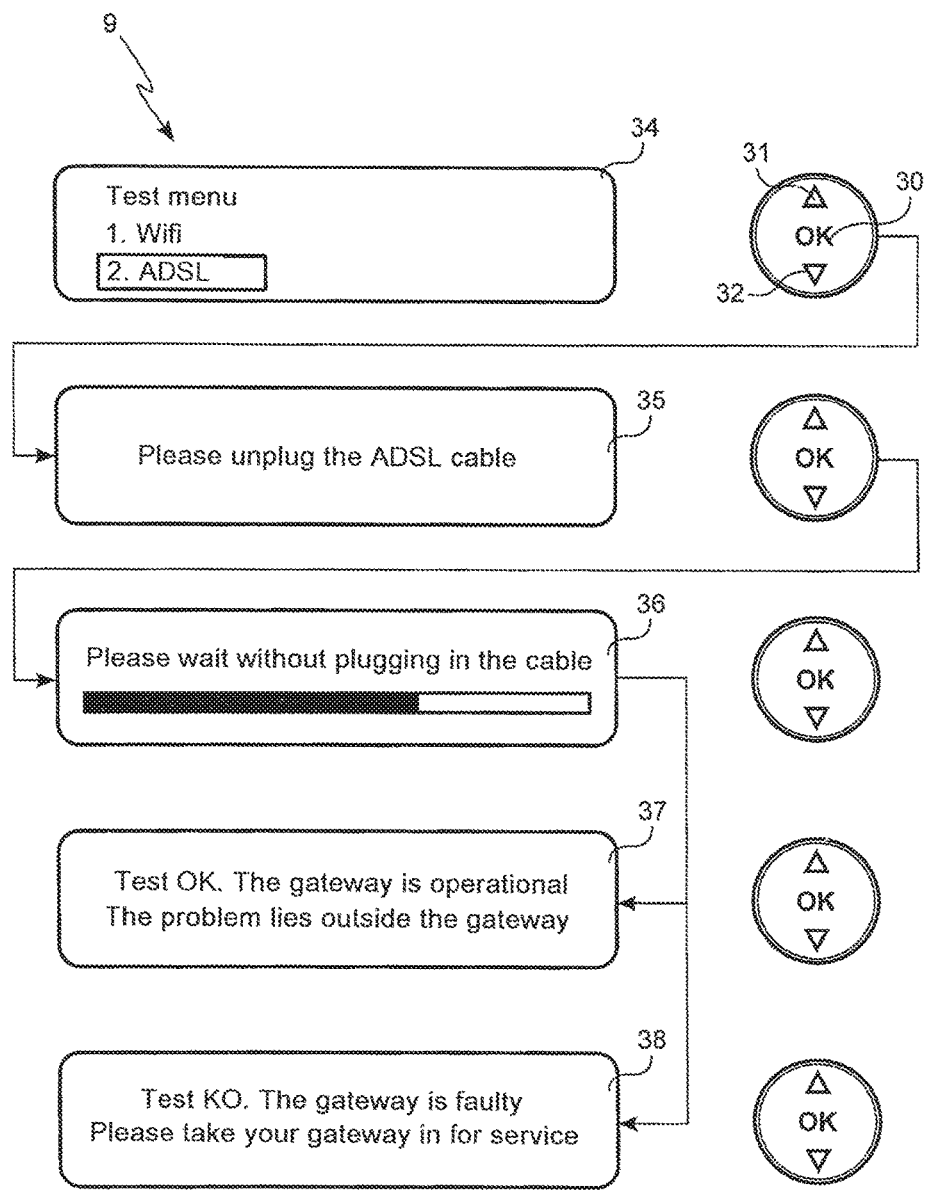
FIG. 10 shows the steps of the test method of the invention.

With reference to FIG. 10, the user interacts with the LCD display 9 of the residential gateway and with an "ok" button 30, an "up" arrow 31, and a "down" arrow 32. The "up" arrow 31 and the "down" arrow 32 enable the user to select options that appear in menus displayed by the LCD display 9, whereas the "ok" button 30 serves to validate the selection.

The test process begins with a configuration step, during which the user selects to put the residential gateway 1 into the test mode.

Selecting the test mode leads to a first menu 34 being displayed that invites the user to select between testing the ADSL communications interface 11 or testing a WiFi communications interface (which WiFi test is not described further herein since it does not involve the invention). After selecting to test the ADSL communications interface 11, the user is invited by a second menu 35 to disconnect the electric cable 6 from the residential gateway 1.

Thereafter the communications interface 11 uses the detector means 23 of the female electric connector 7 to verify whether the male electric connector 8 has indeed been disconnected. If not, the user is invited once more to disconnect the electric cable 6. After the electric cable 6 has actually been disconnected, the test module of the communications interface 11 tests the communications interface 11 in co-operation with the resistor 22 of the test means 21 of the female electric connector 7. The user is invited by a third screen 36 to wait without reconnecting the cable 6, for the length of time required by the communications interface 11 to perform the test.

Thereafter, depending on the results of the test, the test method provides a diagnosis that consists in determining whether the communications interface 11 of the residential gateway 1 is or is not faulty. If the communications interface 11 of the residential gateway 1 is not faulty, then a fourth menu 37 tells the examiner, specifying that the problem comes from an element external to the residential gateway 1.

If the communications interface 11 of the residential gateway 1 is faulty, then a fifth menu 38 tells the user, asking the user to take the residential gateway 1 to an agency.

It should be observed that it is entirely possible to perform the test method of the invention without providing the female electric connector 7 with detector means 23. Under such circumstances, after inviting the user to disconnect the electric cable 6 (menu 35), it is desirable to ask the user to confirm disconnection by pressing on the "ok" button 30.

The invention is not limited to the particular implementation described above, but on the contrary it covers any variant coming within the ambit of the invention as defined by the claims.

Although it is stated that the test means are constituted by a single resistor, they could naturally comprise any type of load made up of one or more resistors, inductors, capacitors, and other passive or active components.

Although the female connector of the invention is described as having eight conductor elements, the invention applies to a female electric connector having at least one conductor element. When the female electric connector has a single conductor element, the test means may for example be connected between the conductor element and a conductive portion of the female electric connector that is connected to ground of the electrical appliance when the conductor element is in the rest position.

Although a test module is used that is included in the communications interface for the purpose of testing the operation of the communications interface, it is naturally possible either to use a test module that is situated outside the communications interface, or else to use components of the communications interface that do not form a distinct module.

The invention also applies to types of connector other than RJ45 type connectors, e.g. connectors of the RJ11 type.

The invention claimed is:

1. A locating method for locating a failure impacting an electrical appliance, said electrical appliance having a communications interface, a female communication connector electrically connected to the communications interface, and a test module, said electrical appliance having an internet access through the communication interface via the female communication connector, the female communication connector having at least one conductor element mounted to move between an active position a rest position, the active position being the position into which the conductor element is taken when a male communication connector is inserted in the female communication connector, and the rest position being the position of the conductor element when the male communication connector is not inserted in the female communication connector, the female communication connector including a test means connected to the test module, the test means being connected to the conductor element when it is in the rest position; the locating method comprising:

a disconnection step performed by a user of the electrical appliance and consisting in disconnecting the male communication connector from the female communication connector;

a test step following the disconnection step and consisting in testing the communications interface by the test module in co-operation with the test means of the female communication connector by determining whether the communication interface is or is not functional, the test step being performed without using a separate test accessory; and a locating step consisting in locating the failure in the electrical appliance if the communications interface is faulty or in an element external to the electrical appliance if the communications interface is not faulty.

2. The locating method according to claim 1, wherein the test means include a resistor connected between two first conductor elements of the female communication connector when the two first conductor elements are in the rest position.

3. The locating method according to claim 1, wherein the female communication connector includes detector means for detecting whether the male communication connector is or is not inserted in the female communication connector, and wherein the locating method includes a detection step following the disconnection step and consisting in verifying that the male communication connector is indeed disconnected.

4. The locating method according to claim 3, wherein the user is invited to disconnect the male communication connector if it is not disconnected when the detection step is performed.

5. The locating method according to claim 3, wherein the detector means comprise a shunt that short-circuits two second conductor elements of the female communication connector when the two second conductor elements are in the rest position.

6. The locating method according to claim 1, the electrical appliance comprising a test mode, wherein the disconnection step is preceded by a configuration step consisting in putting the electrical appliance in the test mode.

7. The locating method according to claim 1, the electrical appliance comprising an LCD display and a button, wherein the user interacts with the electrical appliance via the LCD display the button of the electrical appliance.

8. An electrical appliance of the residential gateway type including a communications interface, female communication connector electrically connected to the communications interface, and a test module, the electrical appliance having an Internet access through the communication interface via the female communication connector, the female communication connector having at least one conductor element mounted to move between an active position and a rest position, the active position being the position into which the conductor element is taken when a male communication connector is inserted in the female communication connector, and the rest position being the position of the conductor element when the male communication connector is not inserted in the female communication connector, the female communication connector including test means connected to the test module, the test means being connected to the conductor element when it is in the rest position, the communications interface performing the locating method according to claim 1.

* * * * *

UNITED STATES PATENT AND TRADEMARK OFFICE
CERTIFICATE OF CORRECTION

| | | |
|---|---|---|
| PATENT NO. | : 10,094,870 B2 | Page 1 of 1 |
| APPLICATION NO. | : 15/325330 | |
| DATED | : October 9, 2018 | |
| INVENTOR(S) | : Dangy-Caye | |

It is certified that error appears in the above-identified patent and that said Letters Patent is hereby corrected as shown below:

On the Title Page

Item (71) Applicant should read:
–SAGEMCOM BROADBAND SAS–

Signed and Sealed this
Twenty-ninth Day of January, 2019

Andrei Iancu
*Director of the United States Patent and Trademark Office*